(12) United States Patent
Chen et al.

(10) Patent No.: US 12,119,238 B2
(45) Date of Patent: Oct. 15, 2024

(54) SEMICONDUCTOR BONDING STRUCTURES AND METHODS

(71) Applicant: Taiwan Semiconductor Manufacturing Company, Ltd., Hsinchu (TW)

(72) Inventors: Meng-Tse Chen, Changzhi Township (TW); Hsiu-Jen Lin, Zhubei (TW); Wei-Hung Lin, Xinfeng Township (TW); Kuei-Wei Huang, Hsinchu (TW); Ming-Da Cheng, Jhubei (TW); Chung-Shi Liu, Hsinchu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 269 days.

(21) Appl. No.: 16/588,588

(22) Filed: Sep. 30, 2019

(65) Prior Publication Data

US 2020/0035510 A1    Jan. 30, 2020

Related U.S. Application Data

(62) Division of application No. 16/046,211, filed on Jul. 26, 2018, now Pat. No. 11,749,535, which is a
(Continued)

(51) Int. Cl.
*H01L 21/56*    (2006.01)
*H01L 23/00*    (2006.01)
(Continued)

(52) U.S. Cl.
CPC ............ *H01L 21/563* (2013.01); *H01L 24/97* (2013.01); *H01L 25/0657* (2013.01);
(Continued)

(58) Field of Classification Search
CPC . H01L 21/563; H01L 25/0657; H01L 25/105; H01L 25/50; H01L 24/97; H01L 2224/73204; H01L 2224/8123; H01L 2225/1058; H01L 2224/13111; H01L 2224/81815; H01L 2224/13147; H01L 2224/83191; H01L 2224/14505; H01L 2224/13172; H01L 2224/14181;
(Continued)

(56) References Cited

U.S. PATENT DOCUMENTS 5,341,564 A    8/1994   Akhavain et al.
6,190,940 B1   2/2001   DeFelice et al.
(Continued)

OTHER PUBLICATIONS

Bergenthal, "Reflow Soldering Process Considerations for Surface Mount Application," Kemet Electronics Corporation, www.kemet.com, Jul. 1995 (reprinted Oct. 1997), 11 pgs.

*Primary Examiner* — Marcos D. Pizarro
(74) *Attorney, Agent, or Firm* — Slater Matsil, LLP

(57) ABSTRACT

A system and method for applying an underfill is provided. An embodiment comprises applying an underfill to a substrate and patterning the underfill. Once patterned other semiconductor devices, such as semiconductor dies or semiconductor packages may then be attached to the substrate through the underfill, with electrical connections from the other semiconductor devices extending into the pattern of the underfill.

20 Claims, 4 Drawing Sheets

Related U.S. Application Data division of application No. 14/044,504, filed on Oct. 2, 2013, now Pat. No. 10,153,180.

(51) Int. Cl.
  *H01L 25/00* (2006.01)
  *H01L 25/065* (2023.01)
  *H01L 25/10* (2006.01)

(52) U.S. Cl.
  CPC ............ *H01L 25/105* (2013.01); *H01L 25/50* (2013.01); *H01L 2224/06181* (2013.01); *H01L 2224/1144* (2013.01); *H01L 2224/1145* (2013.01); *H01L 2224/11462* (2013.01); *H01L 2224/11849* (2013.01); *H01L 2224/13111* (2013.01); *H01L 2224/13124* (2013.01); *H01L 2224/13147* (2013.01); *H01L 2224/13155* (2013.01); *H01L 2224/13166* (2013.01); *H01L 2224/13172* (2013.01); *H01L 2224/1403* (2013.01); *H01L 2224/14181* (2013.01); *H01L 2224/14505* (2013.01); *H01L 2224/16145* (2013.01); *H01L 2224/16225* (2013.01); *H01L 2224/16227* (2013.01); *H01L 2224/73204* (2013.01); *H01L 2224/81203* (2013.01); *H01L 2224/8123* (2013.01); *H01L 2224/81815* (2013.01); *H01L 2224/83191* (2013.01); *H01L 2224/83192* (2013.01); *H01L 2224/83855* (2013.01); *H01L 2224/94* (2013.01); *H01L 2224/97* (2013.01); *H01L 2225/06513* (2013.01); *H01L 2225/1023* (2013.01); *H01L 2225/1058* (2013.01); *H01L 2924/12042* (2013.01); *H01L 2924/15311* (2013.01); *H01L 2924/15331* (2013.01); *H01L 2924/15787* (2013.01); *H01L 2924/181* (2013.01)

(58) Field of Classification Search
  CPC ... H01L 2224/13124; H01L 2224/1403; H01L 2224/83192; H01L 2224/16227; H01L 2924/15331; H01L 2225/06513; H01L 2224/11849; H01L 2225/1023; H01L 2224/13155; H01L 2224/16145; H01L 2224/13166; H01L 2224/11462; H01L 2224/81203; H01L 2224/94; H01L 2224/83855; H01L 2224/1145; H01L 2224/06181; H01L 2224/97; H01L 2224/1144; H01L 2924/12042; H01L 2924/181; H01L 2924/15787; H01L 2224/16225; H01L 2924/15311; H01L 2224/81986; H01L 24/17; H01L 2224/1703; H01L 2224/171; H01L 2224/75252; H01L 24/83; H01L 24/81; H01L 24/92; H01L 24/13; H01L 24/16; H01L 24/73; H01L 24/29; H01L 24/32; H01L 2224/32012; H01L 2224/32145; H01L 2224/32225; H01L 2224/92125; H01L 2224/29011; H01L 2224/2929; H01L 2224/16237; H01L 2224/16147; H01L 2224/81191; H01L 21/3157

USPC .......................................................... 257/778

See application file for complete search history.

(56) References Cited

U.S. PATENT DOCUMENTS

| | | | |
|---|---|---|---|
| 6,365,423 B1 | 4/2002 | Heinlein et al. | |
| 6,614,122 B1 | 9/2003 | Dory et al. | |
| 8,158,888 B2 * | 4/2012 | Shen | H01L 23/3128 |
| | | | 174/255 |
| 8,963,339 B2 * | 2/2015 | He | H01L 25/50 |
| | | | 257/E25.011 |
| 2004/0050911 A1 | 3/2004 | Lee | |
| 2004/0080055 A1 * | 4/2004 | Jiang | H01L 24/29 |
| | | | 257/783 |
| 2004/0169275 A1 | 9/2004 | Danvir et al. | |
| 2005/0012208 A1 | 1/2005 | Jang et al. | |
| 2006/0046346 A1 | 3/2006 | Benson et al. | |
| 2006/0211171 A1 * | 9/2006 | Tummala | H01L 24/28 |
| | | | 257/E21.503 |
| 2007/0284758 A1 * | 12/2007 | Zhang | H01L 24/11 |
| | | | 257/780 |
| 2010/0000775 A1 | 1/2010 | Shen et al. | |
| 2011/0048778 A1 * | 3/2011 | Han | H01L 21/563 |
| | | | 174/260 |
| 2011/0316149 A1 * | 12/2011 | Suzuki | H01L 23/49816 |
| | | | 257/737 |
| 2012/0080787 A1 | 4/2012 | Shah et al. | |
| 2012/0153457 A1 | 6/2012 | Shimizu et al. | |
| 2013/0062736 A1 | 3/2013 | Brighton et al. | |
| 2013/0127054 A1 * | 5/2013 | Muthukumar | H01L 23/3121 |
| | | | 257/738 |
| 2013/0134583 A1 * | 5/2013 | Tsukiyama | H01L 25/50 |
| | | | 257/737 |
| 2013/0234344 A1 | 9/2013 | Juskey et al. | |
| 2013/0270685 A1 | 10/2013 | Yim et al. | |
| 2013/0277841 A1 | 10/2013 | Lii et al. | |
| 2014/0057411 A1 | 2/2014 | Hoang et al. | |

* cited by examiner

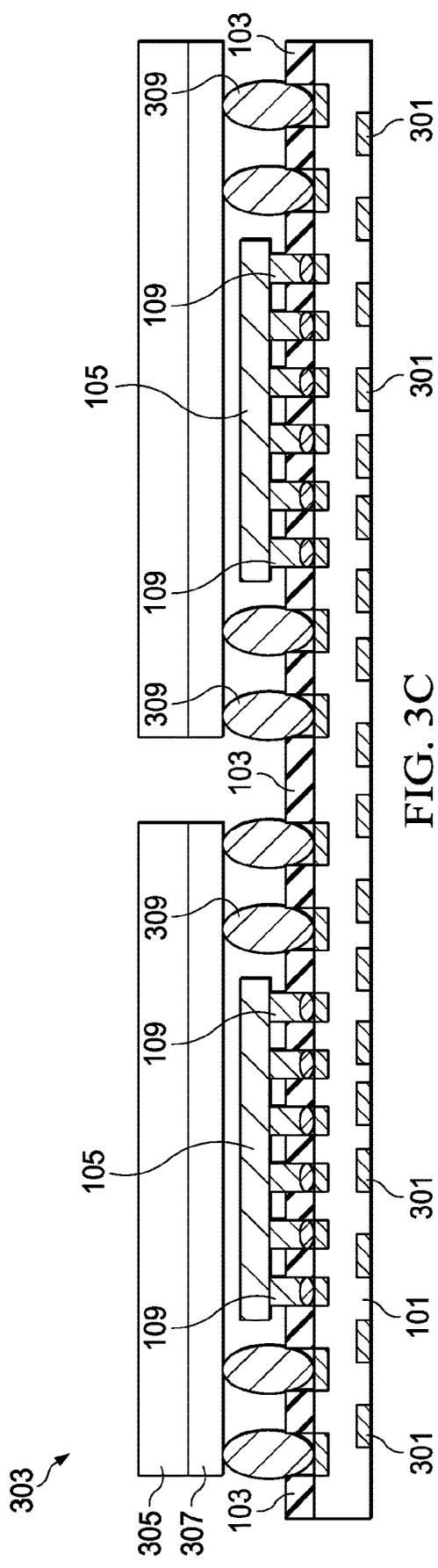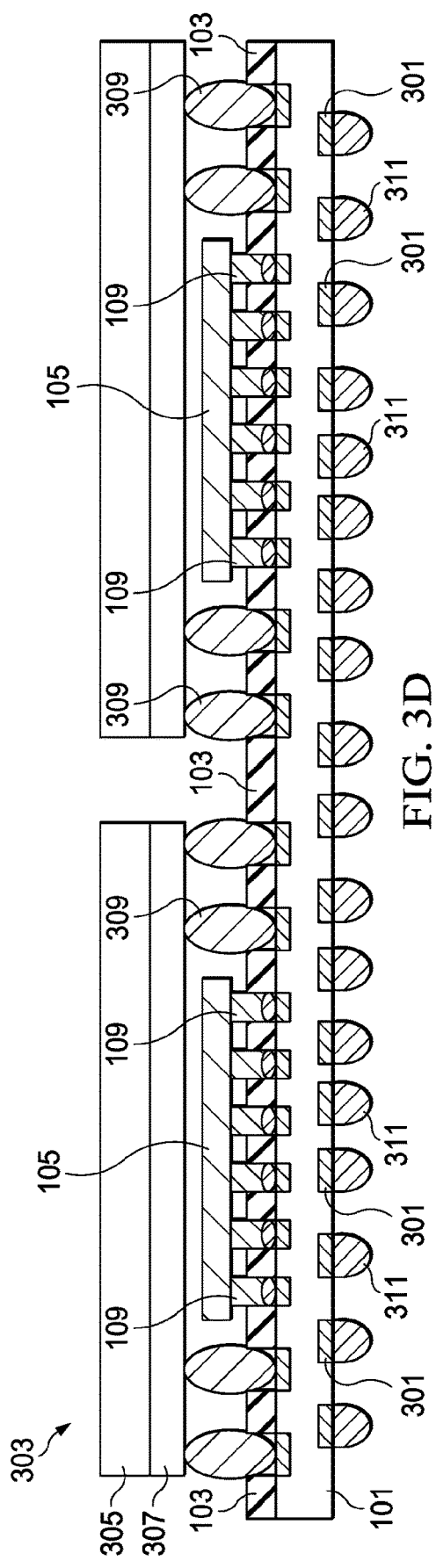

SEMICONDUCTOR BONDING STRUCTURES AND METHODS

PRIORITY CLAIM AND CROSS-REFERENCE

This application is a divisional of U.S. patent application Ser. No. 16/046,211, filed Jul. 26, 2018, entitled "Semiconductor Bonding Structures and Methods," which application is a divisional of U.S. patent application Ser. No. 14/044,504, filed Oct. 2, 2013, entitled "Semiconductor Bonding Structures and Methods," now U.S. Pat. No. 10,153,180 issued on Dec. 11, 2018, which applications are hereby incorporated herein by reference.

BACKGROUND

Generally, semiconductor devices do not work in isolation with other devices. Rather, the devices are both physically and electrically connected to each other in order to send power connections, ground connections, and signals from one device to another device so that the devices can work in tandem with each other to performed the desired functions. Such electrical and physical connecting of semiconductor devices are generally referred to as bonding the semiconductor devices together.

However, the process of bonding two semiconductor devices together is more complicated than simply contacting the two physical structures together. Rather, each semiconductor device has different characteristics, such as different generations of heat, different coefficients of thermal expansions, or the like. As such, semiconductor devices that have been bonded together will have different internal stresses and strains which may also generate stresses and strains between the different devices.

As such, an underfill material may be used to help protect the different semiconductor devices from the stresses and strains caused by the bonding of the different semiconductor devices. The underfill material will also help protect the devices from various environmental hazards that may occur. However, advancements are still needed in the manufacturing and use of the underfill so as to help provide the best and most efficient protection for the semiconductor devices.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 3A-3D illustrate a patterned underfill in a hybrid bonding configuration in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
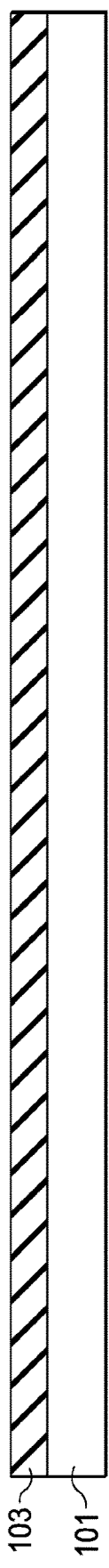
FIGS. 1A-1D illustrate a patterned underfill in a bump on trace bonding configuration in accordance with an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to specific contexts, namely bonding semiconductor devices to each other. Other embodiments may also be applied, however, to other types of bonding.

With reference now to FIG. 1, there is shown a substrate 101 with an underfill 103 applied to the substrate 101. In an embodiment the substrate 101 is a semiconductor wafer that comprises a semiconductor substrate with electronic devices formed therein and/or thereon and can also, but not necessarily, include dielectric and conductive layers to provide connectivity and routing between the electronic devices. There could be any number of alternating layers of conductive and dielectric layer located on the semiconductor substrate, but a typical range of layers would be from three layers to twelve layers of alternating conductive and dielectric layers. The semiconductor wafer may also be separated into a plurality of individual semiconductor dies that remain connected to each other within the semiconductor wafer and are separated by scribe lines between individual ones of the semiconductor dies.

However, the substrate 101 is not intended to be limited to a semiconductor substrate as described above. Rather, any suitable substrate, such as ceramic substrates, polymer substrates, interposers, or any other type of substrate to which semiconductor dies or packages may be physically and electrically connected may also be utilized. All such substrates are fully intended to be included within the scope of the embodiments.

The underfill 103 is placed onto the substrate 101 in order to help protect the substrate 101 and first semiconductor dies 105 (not illustrated in FIG. 1A but illustrated and described below with respect to FIG. 1C) from stresses and the environment after the substrate 101 and the first semiconductor dies 105 have been bonded together. In an embodiment the underfill 103 is an epoxy material that may be placed onto the substrate 101 in a solid state so that is can be patterned, such as by using a lamination process, a coating process or other suitabe dispensing process. Alternatively, the underfill 103 may be a molding compound, benzocyclobutent (BCB), with or without fillers.

In an alternative embodiment, the underfill 103 may be dispensed in a liquid state and then partially cured, but not fully cured, prior to patterning. For example, the underfill 103 may be cured up to a point but can still be crosslinked with, e.g., first semiconductor dies 105 (not illustrated in FIG. 1A but illustrated and described below with respect to FIG. 1C).

Figure 1B:
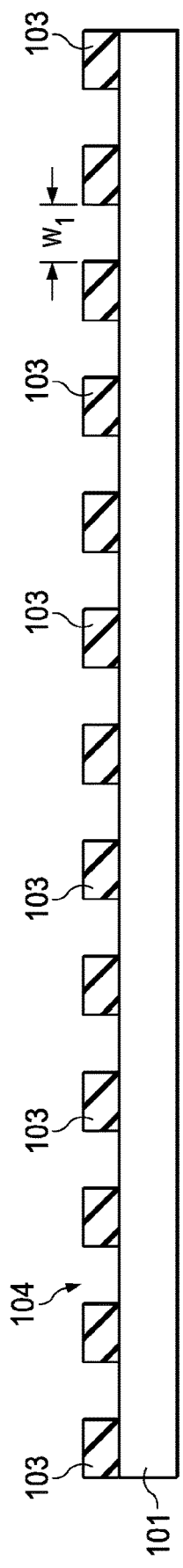

FIG. 1B illustrates a patterning of the underfill 103 in order to form first openings 104 to connect the substrate 101 to other devices, such as the plurality of first semiconductor dies 105 (not illustrated in FIG. 1B but illustrated and discussed below with respect to FIG. 1C). In an embodiment the underfill 103 may be patterned using a photolithographic masking and etching process. In such a process a photosensitive material (not illustrated) is applied to the underfill 103 and exposed to a patterned energy (e.g., light) in order to induce a chemical reaction within those portions of the photosensitive material that were illuminated. The chemical reaction changes a physical property (e.g., polarity) of the illuminated section, and the difference in properties may then be utilized to selectively separate the illuminated portions from the non-illuminated portions using, e.g., a developer. Once the photosensitive material has been patterned, the photosensitive material may be used as a mask to pattern the underfill 103, and then the photosensitive material may be removed using a process such as ashing. In an embodiment the first openings 104 may have a first width $W_1$ of between about 10 µm to about 100 µm, such as about 20 µm, and a ratio between the critical dimension (the smallest width of a line or the smallest space between two lines permitted in the fabrication of the device as measured along a width of the first openings 104) of the first openings 104 and the thickness of the underfill 103 may be about 1:1.

However, a photolithography process such as the one above is intended to be an illustrative embodiment and is not intended to limit the embodiments in any fashion. Rather, any suitable process for patterning the underfill 103, such as laser drilling or even a mechanical process, may alternatively be utilized. All such processes are fully intended to be included within the scope of the embodiments.

Figure 1C:
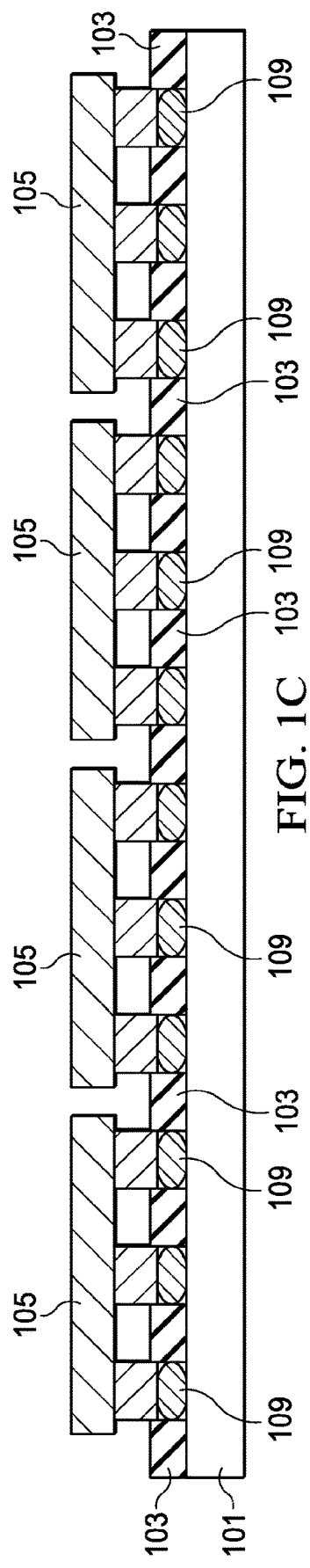

FIG. 1C illustrates a placement of a plurality of first semiconductor dies 105 onto the substrate 101. In an embodiment the plurality of first semiconductor dies 105 may comprise a plurality of active devices and metallization layers (not individually illustrated) and may also comprise first external connectors 109 such as solder bumps. In an embodiment in which the first external connectors 109 are a tin solder material, the first external connectors 109 may be formed by initially forming a layer of tin through any suitable method such as evaporation, electroplating, printing, solder transfer, etc, to a preferred thickness of about 30 µm and to a width that is complementary to the first openings 104. Once a layer of tin has been formed on the structure, a reflow is preferably performed in order to shape the material into the desired bump shape.

To place the first semiconductor dies 105 onto the substrate 101, the first external connectors 109 are aligned with the first openings 104 previously formed in the underfill 103. Once aligned, the first semiconductor dies 105 and the substrate 101 are brought together such that the first external connectors 109 enter into the first openings 104 and extend to the substrate 101 to make electrical and physical contact with the substrate 101.

Figure 1D:
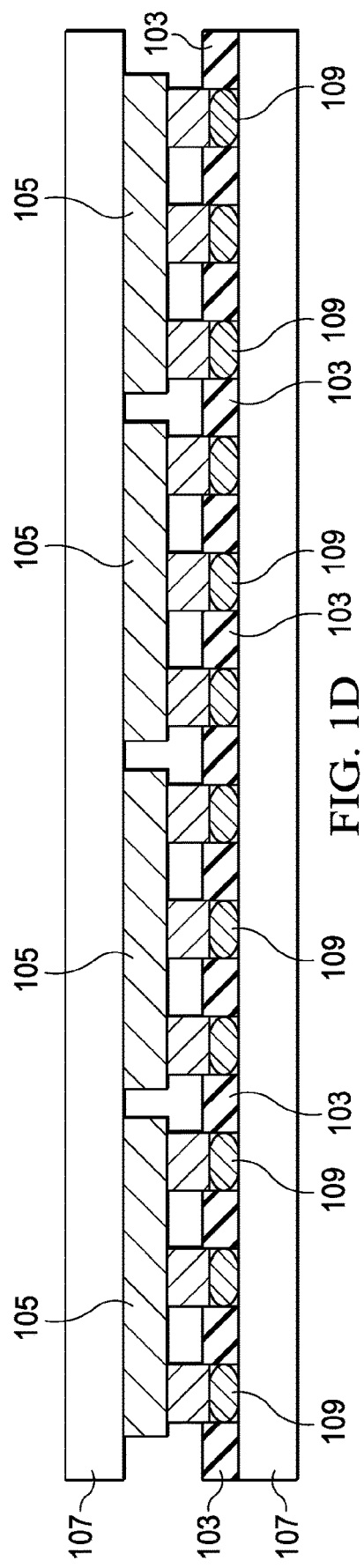

FIG. 1D illustrates a bonding process utilized to physically join the first semiconductor dies 105 to the substrate 101. In an embodiment the bonding process is a thermal compression bonding process, whereby the substrate 101 and the first semiconductor dies 105 are placed between two plates 107 and heat and force are applied to physically bond the first semiconductor dies 105 and the substrate 101. In such a technique the first semiconductor dies 105 and the substrate 101 are heated to a temperature greater than about 150° C., such as about 350° C., while a pressure of between about 1 Mpa and about 100 Mpa, such as about 20 Mpa, is applied.

Alternatively, in an embodiment in which the first external connectors 109 are solder, the bonding process may be a reflow process. In this process the first semiconductor dies 105 and the substrate 101 are placed between the two plates 107 and the temperature of the first external connectors 109 is raised to a suitable temperature such that the solder will reflow. This reflow will bond the first external connectors 109 to the substrate 101.

In yet another example, the bonding process may be a near infrared (NIR) reflow process. In such a process one of the plates 107 (e.g., the plate 107 adjacent to the first semiconductor dies 105) is transparent to near infrared radiation. Then, once the first semiconductor dies 105 and the substrate 101 have been placed between the two plates 107, near infrared radiation may be directed through the plate 107 to the first external connectors 109, causing the first external connectors to reflow and bond the first semiconductor dies 105 to the substrate 101.

Once the first semiconductor dies 105 have been bonded to the substrate 101, a thermal process may be utilized such that the underfill 103 may be cured in order to harden it and provide additional protection to the first semiconductor dies 105 and the substrate 101. In an embodiment the thermal process may be performed by placing the underfill 103 (along with the substrate 101 and the first semiconductor dies 105) into a furnace or other device in order to raise the temperature of the underfill 103 so as to cure the underfill. For example, in an embodiment in which the underfill 103 is an epoxy, the underfill 103 may be cured at a temperature of between about 100° C. and about 200° C., such as about 150° C., for a time of between about 5 hours and about 1 hour, such as about 2 hours.

By using a patterned underfill 103 along with collective bonding, any shifting of dies during the collective bonding process can be minimized, thereby helping with alignment. This can also prevent any bridging of joints, and helps to prevent any debris, filler, or epoxy from interfering with the joint surfaces of the connections. All of this allows for an easier time and curing control of the underfill 103

Figure 2A:
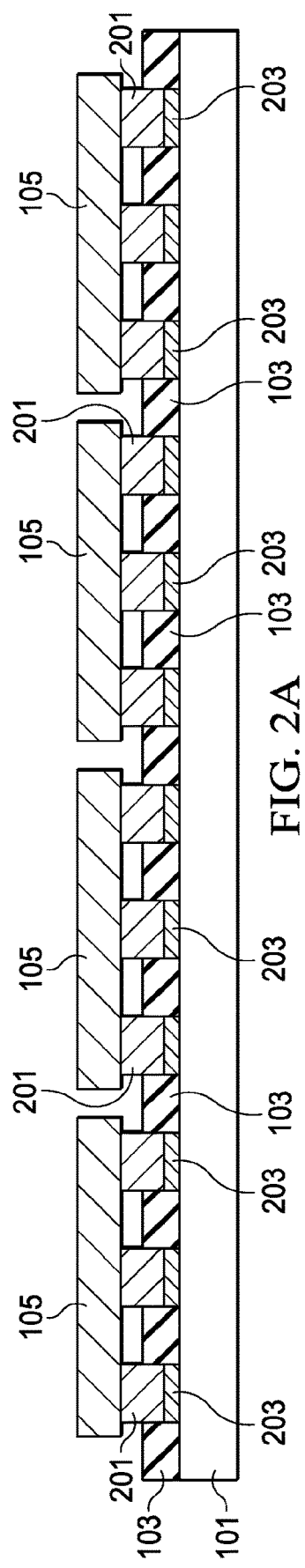
FIGS. 2A-2B illustrate a patterned underfill in a lead-free bonding configuration in accordance with an embodiment.

FIG. 2A illustrates another embodiment in which a patterned underfill 103 is utilized for bonding semiconductor devices together. In this embodiment the first semiconductor dies 105, instead of having solder bumps, utilize a lead free material on the first semiconductor dies 105, such as conductive pillars 201. In an embodiment the conductive pillars 201 may be formed by initially forming and patterning a photoresist (not shown) over the first semiconductor dies 105. The conductive pillars 201 may be formed within the pattern of the photoresist by first forming a seed layer (not shown) and then forming the conductive pillars 201 using the seed layer as an initiator. The conductive pillars 201 may be formed from a conductive material such as copper, although other conductive materials such as nickel, titanium (Ti), vanadium (V), or aluminum (Al), combinations of these, and the like may also be used. Additionally, the conductive pillars 201 may be formed using a process such as electroplating, by a combination of current and immersion within a solution deposit, e.g., copper within the openings in order to fill and/or overfill the openings of the photoresist, thereby forming the conductive pillar. After the conductive pillars 201 have been formed, the photoresist may be removed.

On the substrate 101, the underfill 103 may be placed and patterned as described above with respect to FIG. 1B. However, once the underfill 103 has been patterned, a conductive material 203 may be placed within the first openings 104 in order to provide a contact for the conductive pillars 201 during bonding. In an embodiment the conductive material 203 is solder and may be placed within the first openings 104 using a process such as plating, although any suitable process may alternatively be used, and the conductive material 203 can have a thickness of between about 1 µm and about 20 µm, such as about 5 µm.

Figure 2B:
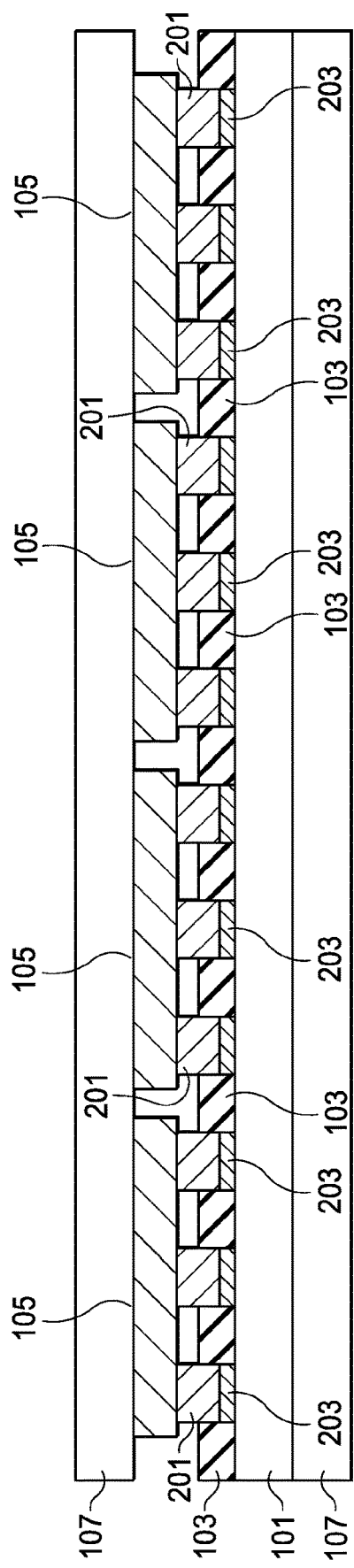

FIG. 2B illustrates that, once the conductive pillars 201 have been formed, the first semiconductor dies 105 may be aligned with the first openings 104 and the first semiconductor dies 105 and the substrate 101 may be brought together. Once together, the first semiconductor dies 105 and the substrate 101 may be bonded together using, e.g., thermal compression bonding, a reflow process, or an NIR reflow process, as described above with respect to FIG. 1D, although any suitable bonding process may alternatively be utilized.

Figure 3A:
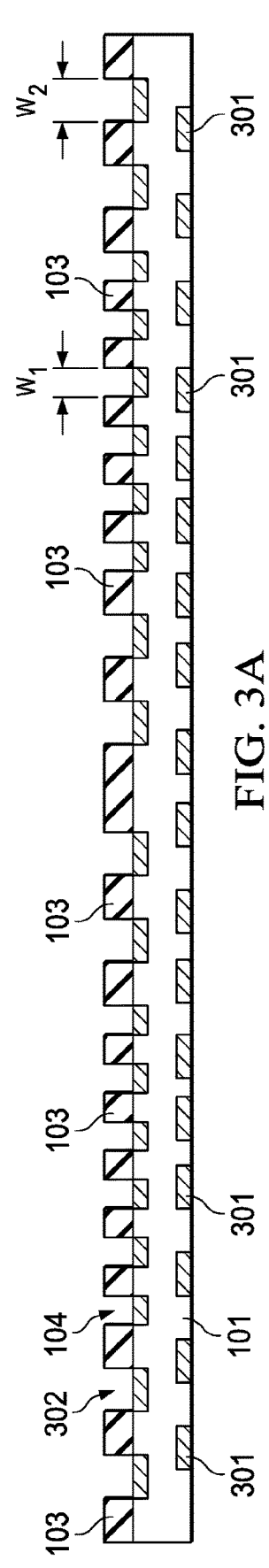

FIG. 3A illustrates an embodiment in which a patterned underfill 103 is utilized in a hybrid bonding configuration. In the particular embodiment illustrated in FIG. 3A, the substrate 101 is bonded to both the first semiconductor dies 105 in, e.g., a bump on trace (BOT) configuration and is also bonded to first packages 303 (not illustrated in FIG. 3A but illustrated and described below with respect to FIG. 3C) in, e.g., a package on package (PoP) configuration. In this embodiment the substrate 101 is a package substrate that has a plurality of contact pads 301 on multiple sides of the substrate 101. The contact pads 301 may, but not necessarily, be connected to each other through the use of through substrate vias (TSVs, not individually illustrated in FIG. 3A).

The contact pads 301 are formed in order to provide external contacts for the substrate 101. The contact pads 301 are formed of a conductive material such as aluminum, although other suitable materials, such as copper, tungsten, or the like, may alternatively be utilized. The contact pads 301 may be formed using a process such as CVD, although other suitable materials and methods may alternatively be utilized. Once the material for the contact pads 301 has been deposited, the material may be shaped into the contact pads 301 using, e.g., a photolithographic masking and etching process.

In this embodiment the underfill 103 is placed onto the substrate 101 in a suitable method, such as the method described above with respect to FIG. 1A. However, once the underfill 103 has been placed, the underfill 103 is patterned in order to accommodate both the first semiconductor dies 105 and the first packages 303. For example, while the precise dimensions will depend at least in part on the precise devices to be attached to the substrate 101, in an embodiment, the underfill 103 may be patterned to have the first openings 104 (as described above with respect to FIG. 1B), and may also be patterned (either simultaneously or sequentially) to have second openings 302 sized to receive the first packages 303. In an embodiment, the second openings have a second width $W_2$ of between about 50 μm and about 400 μm, such as about 300 μm.

Figure 3B:
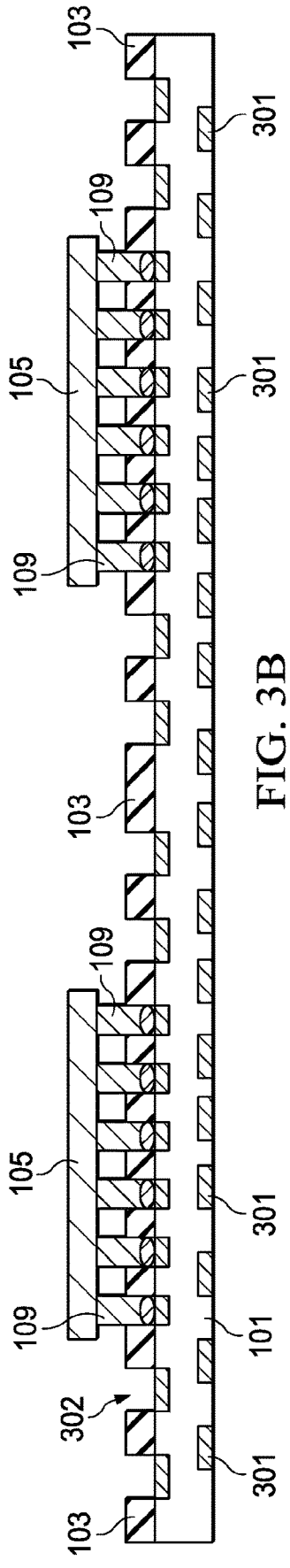

FIG. 3B illustrates a placement of the first semiconductor dies 105 onto the substrate 101, with the first external connectors 109 extending through the first openings 104 to make physical and electrical contact with the contact pads 301 on the substrate 101. Once the first semiconductor dies 105 have all been placed onto the substrate 101, the first semiconductor dies 105 may be collectively bonded to the substrate 101 using a method such as thermal compression bonding (as described above with respect to FIG. 1D), or any other suitable method such as reflowing or NIR reflowing.

However, by patterning the underfill 103 prior to the connection of the first semiconductor dies 105, the underfill 103 remains relatively sturdy and will not be forced (by the first semiconductor dies 105 and the pressure applied) into the surrounding regions. By staying in its place, the underfill 103 will not contaminate other connections, such as the connections exposed by the second openings 302, and reducing overall bond head contamination.

FIG. 3C illustrates that, once the first semiconductor dies 105 have been placed and bonded, the first packages 303 may be placed and bonded onto the substrate 101. In an embodiment the first packages 303 are packages that comprise a semiconductor device that has been placed into a package for protection and connectivity. In an embodiment the first packages 303 comprise a package substrate 305, a redistribution layer 307 over the package substrate 305, and second external connectors 309.

The package substrate 305 may be, e.g., a silicon substrate, doped or undoped, or an active layer of a silicon-on-insulator (SOI) substrate, used to provide support for the first package 100 along with a semiconductor device that has been packaged. However, the package substrate 305 may alternatively be a ceramic substrate, a polymer substrate, an interposer, or any other substrate that may provide a suitable protection and/or fan-out structure that may be desired. These and any other suitable materials may alternatively be used for the package substrate 305.

The redistribution layers 307 are formed on one side of the first packages 303 in order to route electrical connectivity from the package substrate 305 to the second external connectors 309. Additionally, while illustrated in FIG. 3C as a single layer on each one of the first packages 303 for clarity, the redistribution layers 307 are, rather, a series of conductive elements that route electrical signals to individual ones of the second external connectors 309. In an embodiment the redistribution layers 307 are formed using methods for forming interconnect lines in integrated circuits. In an embodiment, the redistribution layers 307 comprise at least one conductive layer formed of a metal such as aluminum, copper, tungsten, titanium, and combinations thereof. The at least one conductive layer may be formed by plating the metal on a seed layer and then etching the undesired portions, leaving the at least one conductive layer, which may have a thickness of between about 2 μm and about 30 μm, with a preferred width of about 5 μm. Once the at least one conductive layer has been formed, a dielectric material may be formed over the at least one conductive layer, and vias may be formed through the dielectric material to provide electrical access to the at least one conductive layer (e.g., for the second external connectors 309). However, other materials and process, such as a well-known damascene process, could alternatively be used to form the redistribution layers 307.

However, as one of skill in the art will recognize, the redistribution layers 307 could be a single layer of conductive material or else could alternatively be multiple layers of conductive material, depending upon the properties desired. For example, the redistribution layers 307 as formed above may be plated with another conductive material such as gold or chromium to provide good adhesion for a subsequently formed connector (described below). This plating could be done through a process such as CVD.

The second external connectors 309 are formed to the redistribution layers 307 and provide electrical connections between the redistribution layers 307 (and, therefore, the package substrate 305) and the substrate 101 once the first packages 303 have been bonded to the substrate 101. In an embodiment the second external connectors 309 are solder balls and may comprise a tin solder material. In such an embodiment the first external connectors 109 may be formed by initially forming a layer of tin through any suitable method such as evaporation, electroplating, printing, solder transfer, etc, to a preferred thickness of about 30 μm and to a width that is complementary to the second openings 302. Once a layer of tin has been formed on the structure, a reflow is preferably performed in order to shape the material into the desired bump shape.

To place the first packages 303, the second external connectors 309 are aligned with the second openings 302 and the second external connectors 309 are put into contact with the substrate 101. Once in physical contact, the first packages 303 may then be collectively bonded to the substrate 101 using a process such as thermal compression bonding, a reflow process, or a NIR reflow process (similar to the processes described above with respect to FIG. 1D), although any other suitable bonding process may alternatively be used.

FIG. 3D illustrates the formation of third external connectors 311 to a backside of the substrate 101, along with a singulation of the substrate 101. In an embodiment the third external connectors 311 may be solder balls, such as a tin solder material. In such an embodiment the third external connectors 311 may be formed by initially forming a layer of tin through any suitable method such as evaporation, electroplating, printing, solder transfer, etc, to a preferred thickness of about 30 μm. Once a layer of tin has been formed on the structure, a reflow is preferably performed in order to shape the material into the desired bump shape.

After the third external connectors 311 have been formed, the substrate 101 may be singulated in order to separate the individual devices from each other. In an embodiment the substrate 101 may be singulated using, e.g., a diamond coated saw to cut through the substrate 101. However, physical sawing is only one possible method of singulation, and any other suitable method, such as etching or the like, may alternatively be utilized. All such methods are fully intended to be included within the scope of the embodiments.

In an embodiment, a method of manufacturing a device comprising applying an underfill material to a substrate and patterning the underfill material. A first semiconductor device is bonded to the substrate, at least a portion of the first semiconductor device extending through the underfill material.

In another embodiment, a method of manufacturing a device comprising applying an underfill material onto a substrate and forming a first plurality of openings into the underfill material to expose a first portion of the substrate is provided. After the forming the first plurality of openings, a first electrical contact is placed through one of the first plurality of openings.

In yet another embodiment, a semiconductor device comprising a substrate and an underfill material over the substrate and extending to an outer edge of the substrate, the underfill material having a planar top surface, is provided. A patterned first set of openings is in the underfill material, the first set of openings exposing a portion of the substrate, and a first semiconductor device is over the substrate, the first semiconductor device comprising first connectors that extend through the patterned first set of openings to make physical and electrical contact with the substrate.

Although the present embodiments and their advantages have been described in detail, it should be understood that various changes, substitutions and alterations can be made herein without departing from the spirit and scope of the disclosure as defined by the appended claims. For example, the precise method of bonding may be modified to any suitable method of electrically and physically connecting the various devices together. Additionally, the collective bonding with a patterned underfill may also be used with other bonding configurations, such as chip on wafer (CoW), wafer on wafer (WoW), or the like.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
   removing a first portion of an underfill material to form a first opening exposing a first portion of a substrate, the first opening having a first width and a first depth;
   removing a second portion of the underfill material to form a second opening exposing a second portion of the substrate, the second opening having a second width and a second depth, the second width being different from the first width, the second depth being the same as the first depth, wherein the removing the first portion of the underfill material and the removing the second portion of the underfill material are performed simultaneously, and wherein after removing the first portion of the underfill material and the second portion of the underfill material, the remaining portion of the underfill material has a planar top surface;
   after the removing the first portion of the underfill material, placing a first external connector into physical contact with the first portion of the substrate, the first external connector having a third width; and
   after the removing the second portion of the underfill material, bonding a first package to the substrate by placing a second external connector into physical contact with the second portion of the substrate, the second external connector having a fourth width larger than the third width, wherein a continuous flat top surface of the underfill material between the first external connector and the second external connector is exposed while bonding the first package by placing the second external connector.

2. The method of claim 1, wherein the second width is between about 50 μm and about 300 μm.

3. The method of claim 1, wherein the second external connector is a solder ball connected to a first package.

4. The method of claim 3, wherein the first external connector is a solder ball connected to a first semiconductor die.

5. The method of claim 3, wherein the first external connector is a copper pillar connected to a first semiconductor die.

6. A method of manufacturing a semiconductor device, the method comprising:
   applying an underfill material to a substrate;
   patterning the underfill material to form a first opening through the underfill material and a second opening through the underfill material, wherein the patterning the underfill to form the first opening and the second opening are performed simultaneously, wherein the first opening has a first width, the second opening has a second width, and the first width is different from the second width, wherein the first opening has a first depth, the second opening has a second depth, and the second depth is the same as the first depth, wherein the patterning the underfill material removes material of the underfill material to expose the substrate; and
   after the patterning the underfill material, bonding a first semiconductor die to the substrate through the first opening and bonding a first package to the substrate through the second opening, wherein bonding the first package to the substrate comprises forming a first external connector in physical contact with the substrate and with the first package, wherein the first external connector comprises a first material extending from a bottom surface of the second opening to a bottom surface of the first package, wherein a portion of a continuous sidewall of the first external connector is free of contact with the underfill material, and wherein a top surface of the underfill material adjacent the second opening is exposed while bonding the first package to the substrate.

7. The method of claim 6, further comprising forming second external connectors to the substrate, wherein the second external connectors are located on an opposite side of the substrate from the first semiconductor die.

8. The method of claim 6, wherein the first width is between about 10 µm and about 100 µm.

9. The method of claim 8, wherein the second width is between about 50 µm and about 400 µm.

10. The method of claim 6, further comprising partially curing the underfill material prior to the patterning the underfill material.

11. The method of claim 10, further comprising curing the underfill material after the bonding the first semiconductor die.

12. A method of manufacturing a semiconductor device, the method comprising:
  laminating an underfill material onto a substrate, wherein after the laminating the underfill material the entirety of the underfill material has an uppermost planar surface facing away from the substrate;
  removing a first portion of the underfill material to form a first opening exposing a first portion of a substrate, the first opening having a first width and a first depth;
  after the removing the first portion of the underfill material, bonding a first semiconductor die to the substrate with a first external connector;
  removing a second portion of the underfill material to form a second opening exposing a second portion of a substrate, the second opening having a second width and a second depth;
  the second width being different from the first width, the second depth being the same as the first depth, wherein removing the first portion of the underfill material and removing the second portion of the underfill material are performed simultaneously; and
  after the laminating the underfill material, bonding a first package to the substrate with a second external connector, the first external connector having a third width, the second external connector having a fourth width larger than the third width, wherein the second external connector physically contacts a top surface of the substrate and a bottom surface of the first package, wherein the second external connector comprises a first material extending from the top surface of the substrate to the bottom surface of the first package, wherein a sidewall of the second external connector is partially exposed from the underfill material, and wherein the uppermost planar surface of the underfill material is exposed while bonding the first package to the substrate.

13. The method of claim 12, further comprising partially curing the underfill material prior to the bonding a first semiconductor die.

14. The method of claim 13, further comprising fully curing the underfill material after the bonding the first semiconductor die.

15. The method of claim 12, wherein after removing the first portion of the underfill material and removing the second portion of the underfill material, a first portion of the uppermost planar surface of the underfill material abuts a sidewall of the first opening and a sidewall of the second opening.

16. The method of claim 15, wherein after bonding the first package to the substrate, a cavity extends continuously from the first portion of the uppermost planar surface of the underfill material to the bottom surface of the first package.

17. The method of claim 12, wherein the bonding the first semiconductor die comprises placing the first external connector within the first opening and wherein the bonding the first package comprises placing the second external connector within the second opening.

18. The method of claim 17, wherein the first external connector comprises a copper pillar and the second external connector comprises solder.

19. The method of claim 17, wherein the first opening has a first width of between about 10 µm and about 100 µm.

20. The method of claim 19, wherein the second opening has a second width of between about 50 µm and about 400 µm.

* * * * *